United States Patent
Wada et al.

(10) Patent No.: US 10,825,903 B2
(45) Date of Patent: Nov. 3, 2020

(54) SILICON CARBIDE EPITAXIAL SUBSTRATE AND METHOD FOR MANUFACTURING SILICON CARBIDE SEMICONDUCTOR DEVICE

(71) Applicant: Sumitomo Electric Industries, Ltd., Osaka-shi (JP)

(72) Inventors: Keiji Wada, Itami (JP); Tsutomu Hori, Itami (JP); Hironori Itoh, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 16/482,593

(22) PCT Filed: Oct. 3, 2017

(86) PCT No.: PCT/JP2017/035918
§ 371 (c)(1),
(2) Date: Jul. 31, 2019

(87) PCT Pub. No.: WO2018/142668
PCT Pub. Date: Aug. 9, 2018

(65) Prior Publication Data
US 2019/0355820 A1    Nov. 21, 2019

(30) Foreign Application Priority Data

Jan. 31, 2017   (JP) .................................. 2017-015501

(51) Int. Cl.
*H01L 29/16*    (2006.01)
*H01L 21/02*    (2006.01)
(Continued)

(52) U.S. Cl.
CPC ...... *H01L 29/1608* (2013.01); *H01L 21/0262* (2013.01); *H01L 21/02529* (2013.01); *H01L 29/045* (2013.01); *H01L 29/78* (2013.01)

(58) Field of Classification Search
CPC .................................................. H01L 29/1608
(Continued)

(56) References Cited

U.S. PATENT DOCUMENTS

| | | | |
|---|---|---|---|
| 2012/0056201 A1* | 3/2012 | Wada | C30B 23/00 |
| | | | 257/77 |
| 2015/0072100 A1* | 3/2015 | Genba | C30B 29/36 |
| | | | 428/64.1 |

(Continued)

FOREIGN PATENT DOCUMENTS

| | | |
|---|---|---|
| JP | 2013-014469 A | 1/2013 |
| JP | 2013-162112 A | 8/2013 |

(Continued)

*Primary Examiner* — Ajay Arora
(74) *Attorney, Agent, or Firm* — Baker Botts L.L.P.; Michael A. Sartori

(57) ABSTRACT

Assuming that one or more defects satisfying relations of Formula 1 and Formula 2 are first defects, and one or more defects satisfying relations of Formula 3 and Formula 2 are second defects, where an off angle is θ°, the thickness of a silicon carbide layer in a direction perpendicular to a second main surface is W μm, the width of each of the one or more defects in a direction obtained by projecting a direction parallel to an off direction onto the second main surface is L μm, and the width of each of the one or more defects in a direction perpendicular to the off direction and parallel to the second main surface is Y μm, a value obtained by dividing the number of the second defects by the sum of the number of the first defects and the number of the second defects is greater than 0.5.

16 Claims, 7 Drawing Sheets

(51) Int. Cl.
*H01L 29/04* (2006.01)
*H01L 29/78* (2006.01)

(58) Field of Classification Search
USPC .......................................................... 257/77
See application file for complete search history.

(56) References Cited

U.S. PATENT DOCUMENTS

2018/0363166 A1\* 12/2018 Wada .................. H01L 21/0262
2020/0013858 A1\* 1/2020 Itoh ................... H01L 21/02378

FOREIGN PATENT DOCUMENTS

| JP | 2014-170891 A | 9/2014 |
| JP | 2016-213473 A | 12/2016 |
| JP | 2017-043525 A | 3/2017 |

\* cited by examiner

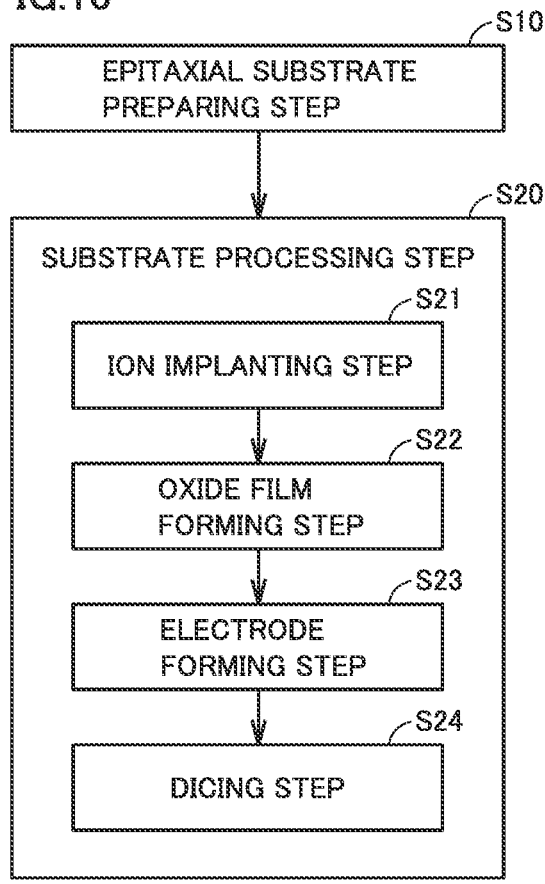
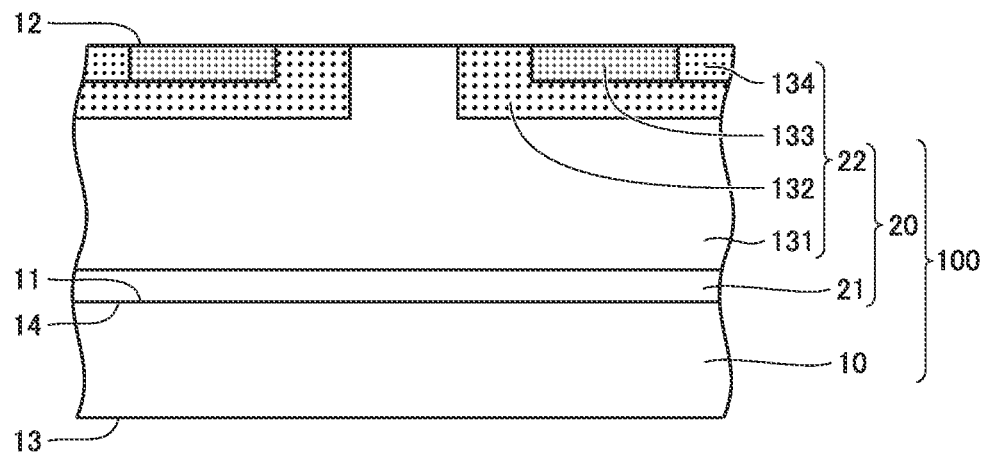

SILICON CARBIDE EPITAXIAL SUBSTRATE AND METHOD FOR MANUFACTURING SILICON CARBIDE SEMICONDUCTOR DEVICE

TECHNICAL FIELD

The present disclosure relates to a silicon carbide epitaxial substrate and a method for manufacturing a silicon carbide semiconductor device. The present application claims priority to Japanese Patent Application No. 2017-015501 filed on Jan. 31, 2017, the entire contents of which are incorporated herein by reference.

BACKGROUND ART

Japanese Patent Laying-Open No. 2014-170891 (PTL 1) discloses a method for epitaxially growing a silicon carbide layer on a silicon carbide single-crystal substrate.

CITATION LIST

Patent Literature

PTL 1: Japanese Patent Laying-Open No. 2014-170891

SUMMARY OF INVENTION

A silicon carbide epitaxial substrate according to the present disclosure includes: a silicon carbide single-crystal substrate having a first main surface; and a silicon carbide layer on the first main surface. The silicon carbide layer includes a surface in contact with the silicon carbide single-crystal substrate, and a second main surface opposite to the surface. The second main surface is a plane inclined at an off angle in an off direction relative to a {0001} plane. The second main surface has one or more defects. Assuming that the one or more defects satisfying relations of Formula 1 and Formula 2 are first defects, and the one or more defects satisfying relations of Formula 3 and Formula 2 are second defects, where the off angle is θ°, a thickness of the silicon carbide layer in a direction perpendicular to the second main surface is W μm, a width of each of the one or more defects in a direction obtained by projecting a direction parallel to the off direction onto the second main surface is L μm, and a width of each of the one or more defects in a direction perpendicular to the off direction and parallel to the second main surface is Y μm, then a value obtained by dividing a number of the second defects by a sum of a number of the first defects and the number of the second defects is greater than 0.5:

$$\frac{L}{Y} \leq 1 \qquad \text{Formula 1}$$

$$0.8 \times \frac{W}{\tan\theta} < L < 1.2 \times \frac{W}{\tan\theta} \qquad \text{Formula 2}$$

$$1 < \frac{L}{Y} \qquad \text{Formula 3}$$

BRIEF DESCRIPTION OF DRAWINGS

FIG. 10 is a flowchart schematically showing a method for manufacturing a silicon carbide semiconductor device according to the present embodiment.

FIG. 11 is a schematic sectional view showing a first step of the method for manufacturing the silicon carbide semiconductor device according to the present embodiment.

DETAILED DESCRIPTION

Figure 1:
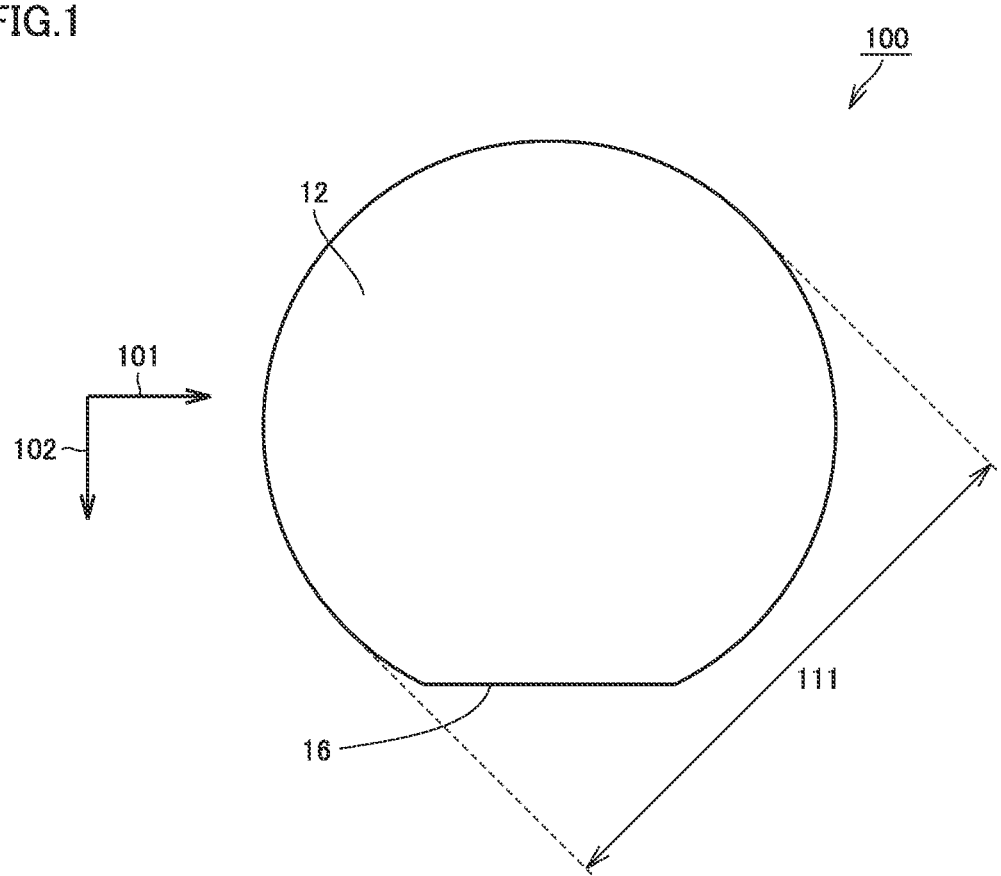
FIG. 1 is a schematic plan view showing the configuration of a silicon carbide epitaxial substrate according to the present embodiment.

Summary of Embodiment of the Present Disclosure

A summary of an embodiment of the present disclosure is provided first. Regarding crystallographic indications herein, an individual orientation is represented by [ ], a group orientation is represented by < >, an individual plane is represented by ( ), and a group plane is represented by { }. Although a crystallographically negative index is normally expressed by a number with a bar "-" thereabove, a negative sign herein precedes a number to indicate a crystallographically negative index.

(1) A silicon carbide epitaxial substrate 100 according to the present disclosure includes: a silicon carbide single-crystal substrate 10 having a first main surface 11; and a silicon carbide layer 20 on first main surface 11. Silicon carbide layer 20 includes a surface 14 in contact with silicon carbide single-crystal substrate 11, and a second main surface 12 opposite to surface 14. Second main surface 12 is a plane inclined at an off angle in an off direction relative to a {0001} plane. Second main surface 12 has one or more defects. Assuming that the one or more defects satisfying relations of Formula 1 and Formula 2 are first defects 1, and the one or more defects satisfying relations of Formula 3 and Formula 2 are second defects 2, where the off angle is θ°, a thickness of silicon carbide layer 20 in a direction perpendicular to second main surface 12 is W μm, a width of each of the one or more defects in a direction parallel to a direction obtained by projecting the off direction onto second main surface 12 is L μm, and a width of each of the one or more defects in a direction perpendicular to the off direction and parallel to second main surface 12 is Y μm, then a value obtained by dividing a number of second defects 2 by a sum of a number of first defects 1 and the number of second defects 2 is greater than 0.5. As a result, two-dimensional extension of the one or more defects can be suppressed.

(2) In silicon carbide epitaxial substrate 100 according to (1) above, the thickness of silicon carbide layer 20 may be 5 μm or more and 100 μm or less.

(3) In silicon carbide epitaxial substrate 100 according to (1) or (2) above, the off angle may be greater than 0° and smaller than or equal to 8°.

(4) In silicon carbide epitaxial substrate 100 according to any one of (1) to (3) above, the value obtained by dividing the number of second defects 2 by the sum of the number of first defects 1 and the number of second defects 2 may be greater than 0.6.

(5) In silicon carbide epitaxial substrate 100 according to (4) above, the value obtained by dividing the number of second defects 2 by the sum of the number of first defects 1 and the number of second defects 2 may be greater than 0.7.

(6) In silicon carbide epitaxial substrate 100 according to (5) above, the value obtained by dividing the number of second defects 2 by the sum of the number of first defects 1 and the number of second defects 2 may be greater than 0.8.

(7) In silicon carbide epitaxial substrate 100 according to (6) above, the value obtained by dividing the number of second defects 2 by the sum of the number of first defects 1 and the number of second defects 2 may be greater than 0.9.

(8) A method for manufacturing a silicon carbide semiconductor device 300 according to the present disclosure includes the following steps. Silicon carbide epitaxial substrate 100 according to any one of (1) to (7) above is prepared. Silicon carbide epitaxial substrate 100 is processed.

Details of Embodiment of the Present Disclosure

The details of the embodiment of the present disclosure are described below. In the following description, the same or corresponding elements are designated by the same characters and the same description thereof will not be repeated.

(Silicon Carbide Epitaxial Substrate)

Figure 2:
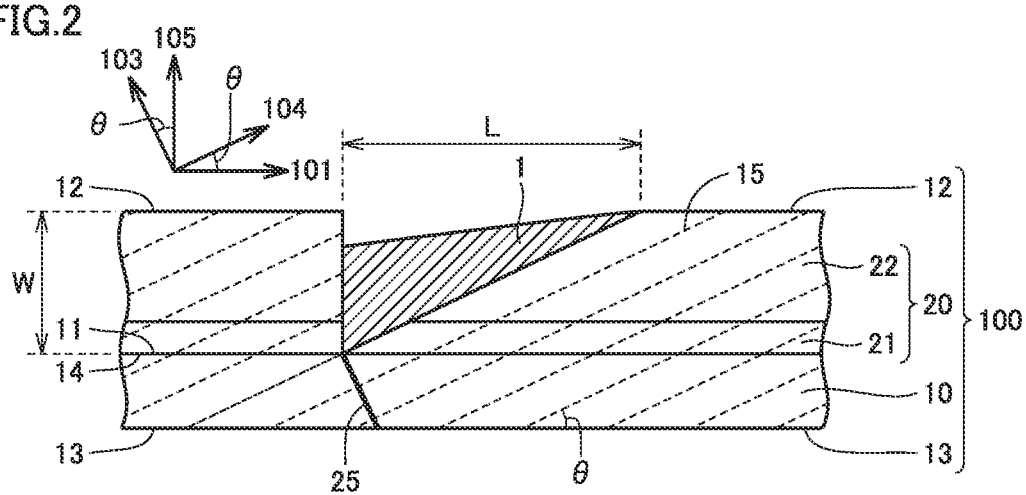
FIG. 2 is a schematic sectional view taken along the line II-II in a direction of arrows in FIG. 3.

As shown in FIGS. 1 and 2, a silicon carbide epitaxial substrate 100 according to the present embodiment has a silicon carbide single-crystal substrate 10 and a silicon carbide layer 20. Silicon carbide single-crystal substrate 10 includes a first main surface 11, and a third main surface 13 opposite to first main surface 11. Silicon carbide layer 20 includes a fourth main surface 14 in contact with silicon carbide single-crystal substrate 10, and a second main surface 12 opposite to fourth main surface 14. As shown in FIG. 1, silicon carbide epitaxial substrate 100 may be provided with a first flat 16 extending in a first direction 101. Silicon carbide epitaxial substrate 100 may be provided with a second flat (not shown) extending in a second direction 102.

First direction 101 is a direction parallel to second main surface 12 and perpendicular to second direction 102. Second direction 102 is a <1-100> direction, for example. As shown in FIG. 1, a maximum diameter 111 (diameter) of second main surface 12 is 100 mm or more, for example. Maximum diameter 111 may be 150 mm or more, 200 mm or more, or 250 mm or more. The upper limit of maximum diameter 111 is not particularly limited. The upper limit of maximum diameter 111 may be 300 mm, for example.

Silicon carbide single-crystal substrate 10 is made of a silicon carbide single crystal. The silicon carbide single crystal has a polytype of 4H—SiC, for example. 4H—SiC is superior to other polytypes in terms of electron mobility, dielectric strength, and the like. Silicon carbide single-crystal substrate 10 includes an n type impurity such as nitrogen (N). The conductivity type of silicon carbide single-crystal substrate 10 is n type, for example. First main surface 11 is a plane inclined at an angle of 8° or less relative to a {0001} plane. When first main surface 11 is inclined relative to the {0001} plane, an inclination direction of the normal of first main surface 11 is a <11-20> direction, for example.

As shown in FIG. 2, silicon carbide layer 20 is on first main surface 11 of silicon carbide single-crystal substrate 10. Silicon carbide layer 20 is an epitaxial layer. Silicon carbide layer 20 is in contact with first main surface 11. Silicon carbide layer 20 includes an n type impurity such as nitrogen. The conductivity type of silicon carbide layer 20 is n type, for example. The second main surface is a plane inclined at an off angle θ(°) in an off direction relative to a {0001} plane. Specifically, second main surface 12 may be a plane inclined by 8° or less in an off direction relative to a (0001) plane. Alternatively, second main surface 12 may be a plane inclined by 8° or less in an off direction relative to a (000-1) plane. The off direction is a <11-20> direction, for example. The off direction is not limited to the <11-20> direction. The off direction may be a <1-100> direction, for example, or a direction having a <1-100> direction component and a <11-20> direction component.

Off angle θ is the inclination angle of the second main surface relative to a {0001} plane. In other words, off angle θ is the inclination angle of the normal of the second main surface relative to a <0001> direction. Off angle θ is greater than 0° and smaller than or equal to 8°, for example. Off angle θ may be 1° or more, or 2° or more. The off angle may be 7° or less, or 6° or less.

A plane 15 indicated by dashed lines in FIG. 2 is a {0001} plane, for example. A third direction 103 is a direction perpendicular to plane 15. Third direction 103 is a <0001> direction, for example. A fourth direction 104 is a direction perpendicular to third direction 103. Fourth direction 104 is a <11-20> direction, for example. Fourth direction 104 is the off direction. The normal direction of second main surface 12 is a fifth direction 105. The fifth direction is a direction inclined by off angle θ in the off direction relative to the <0001> direction.

Silicon carbide layer 20 includes a buffer layer 21 and a drift layer 22. Buffer layer 21 is in contact with first main surface 11. Buffer layer 21 forms fourth main surface 14 of silicon carbide layer 20. Drift layer 22 is on buffer layer 21. Drift layer 22 forms second main surface 12 of silicon carbide layer 20. Buffer layer 21 includes an n type impurity such as nitrogen. The concentration of the n type impurity included in buffer layer 21 is $1 \times 10^{18}$ cm$^{-3}$, for example. The concentration of the n type impurity included in buffer layer 21 may be $5 \times 10^{17}$ cm$^{-3}$ or more and $1 \times 10^{19}$ cm$^{-3}$ or less, for example. The concentration of an n type impurity included in the drift layer is $3 \times 10^{15}$ cm$^{-3}$, for example. The concentration of the n type impurity included in drift layer 22 is lower than the concentration of the n type impurity included in buffer layer 21. The concentration of the n type impurity included in buffer layer 21 may be lower than the concentration of the n type impurity included in silicon carbide single-crystal substrate 10.

Figure 3:
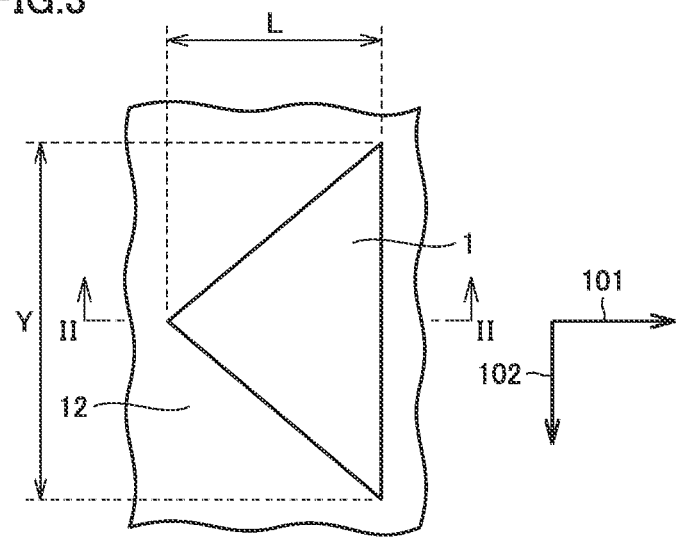
FIG. 3 is a schematic plan view showing the configuration of a first portion of a second main surface of the silicon carbide epitaxial substrate according to the present embodiment.

As shown in FIG. 3, second main surface 12 may have a first defect 1. First defect 1 is a triangle defect, for example. As shown in FIGS. 2 and 3, first defect 1 is a defect that satisfies the relations of aforementioned Formula 1 and aforementioned Formula 2, where the off angle is θ (°), the thickness of the silicon carbide layer in fifth direction 105 perpendicular to second main surface 12 is W (μm), the width of the defect in first direction 101 obtained by projecting a direction parallel to the off direction onto the second main surface is L (μm), and the width of the defect in second direction 102 perpendicular to the off direction and parallel to the second main surface is Y (μm). Thickness W of the silicon carbide layer is 5 μm or more and 100 μm or less, for example. The lower limit of thickness W of the silicon carbide layer is not particularly limited, and may be 10 μm or 20 μm, for example. The upper limit of thickness W of the silicon carbide layer is not particularly limited, and may be 80 μm or 50 μm, for example.

As shown in FIGS. 2 and 3, first defect 1 originates from a threading screw dislocation 25, for example, and extends in first direction 101. When viewed in a direction perpendicular to second main surface 12, first defect 1 extends to cover an area within ±45° relative to first direction 101. When viewed in the direction perpendicular to second main surface 12, first defect 1 has a triangular shape, for example. The polytype of silicon carbide forming first defect 1 is different from the polytype forming silicon carbide layer 20. The polytype of silicon carbide forming first defect 1 may be 3C or 8H, for example. The surface of first defect 1 facing first direction 101 may be aligned with second main surface 12. The surface of first defect 1 facing opposite to first direction 101 may be lower in height than second main surface 12. Second main surface 12 ideally does not have first defect 1.

Figure 4:
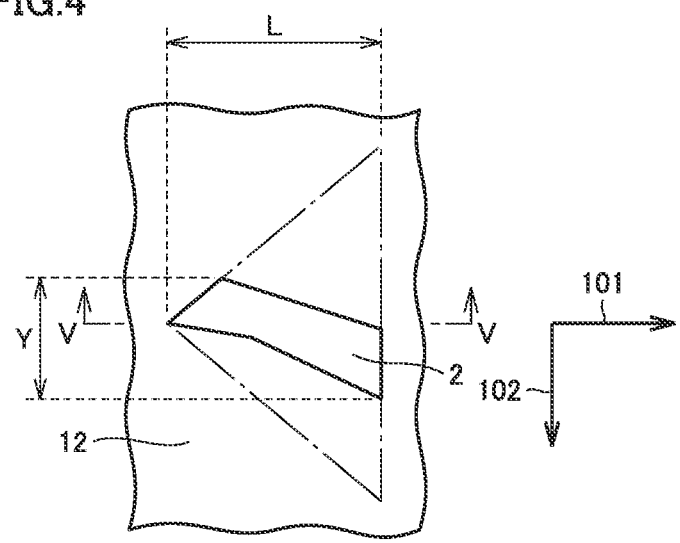
FIG. 4 is a schematic plan view showing the configuration of a second portion of the second main surface of the silicon carbide epitaxial substrate according to the present embodiment.
Figure 5:
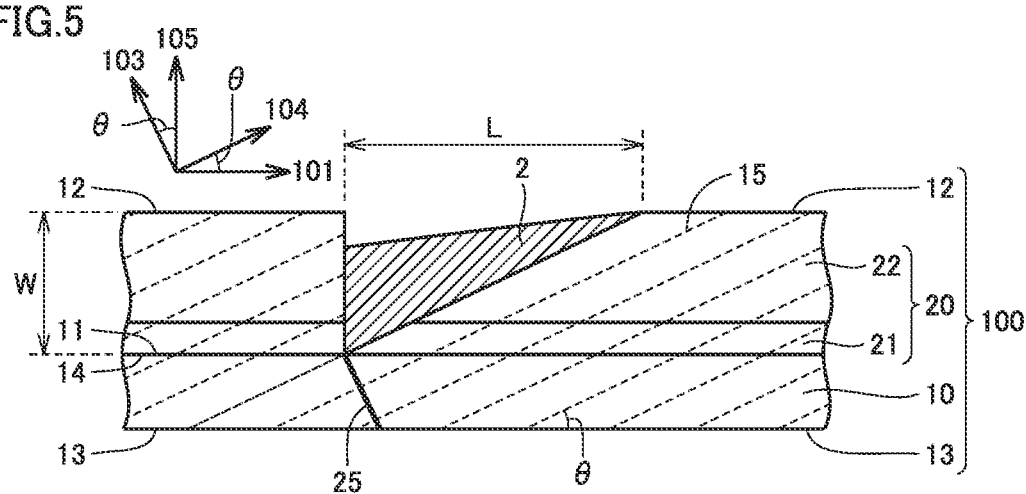
FIG. 5 is a schematic sectional view taken along the line V-V in a direction of arrows in FIG. 4.

As shown in FIG. 4, second main surface 12 has one or more second defects 2. As shown in FIGS. 4 and 5, second defect 2 is a defect that satisfies the relations of Formula 3 and Formula 2, where the off angle is θ (°), the thickness of silicon carbide layer 20 in fifth direction 105 perpendicular to second main surface 12 is W (μm), the width of the defect in first direction 101 obtained by projecting the direction parallel to the off direction onto second main surface 12 is L (μm), and the width of the defect in second direction 102 perpendicular to the off direction and parallel to second main surface 12 is Y (μm).

As shown in FIGS. 4 and 5, second defect 2 originates from threading screw dislocation 25, for example, and extends in first direction 101. When viewed in the direction perpendicular to second main surface 12, second defect 2 may occupy a portion of the area within ±45° relative to first direction 101. When viewed in the direction perpendicular to second main surface 12, second defect 2 may have a polygonal shape with four or more sides, for example. The polytype of silicon carbide forming second defect 2 is different from the polytype forming silicon carbide layer 20. The polytype of silicon carbide forming second defect 2 may be 3C or 8H, for example. The surface of second defect 2 facing first direction 101 may be aligned with second main surface 12. The surface of second defect 2 Facing opposite to first direction 101 may be lower in height than second main surface 12. When viewed in the direction perpendicular to second main surface 12, second defect 2 is smaller in area than first defect 1.

It is desirable to reduce the number of first defects 1 and increase the number of second defects 2 on second main surface 12 of silicon carbide epitaxial substrate 100. In accordance with silicon carbide epitaxial substrate 100 according to the present embodiment, a value obtained by dividing the number of second defects 2 by the sum of the number of first defects 1 and the number of second defects 2 is greater than 0.5. For example, when the number of the first defects is one and the number of the second defects is nine on second main surface 12, the value obtained by dividing the number of second defects 2 by the sum of the number of first defects 1 and the number of second defects 2 is 9/(1+9)=0.9. The value obtained by dividing the number of second defects 2 by the sum of the number of first defects 1 and the number of second defects 2 may be greater than 0.6, greater than 0.7, greater than 0.8, or greater than 0.9.

(Method for Measuring the Number of Defects)

The number of first defects 1 and second defects 2 can be measured by observation of second main surface 12 of silicon carbide epitaxial substrate 100 using a defect inspection device including a confocal differential interference microscope, for example. As the defect inspection device including the confocal differential interference microscope, the WASAVI series "SICA 6X" manufactured by Lasertec Corporation can be used, for example. The objective lens has a magnification of 10×. A threshold value of detection sensitivity of this defect inspection device is decided using a standard sample. This defect inspection device can be used to quantitatively evaluate the number of first defects 1 and second defects 2.

Specifically, second main surface 12 is first divided into a plurality of observed areas. One observed area is a 1.3 mm×1.3 mm square region, for example. Images of all observed areas are taken. The image of each observed area is processed with a prescribed method, to identify detects in the image. Based on the dimensions of the defects, the identified defects are classified into first defect 1, second defect 2 and other defects. The number of first defects 1 and second defects 2 is calculated in each of the observed areas of second main surface 12, to determine the number of first defects 1 and second defects 2 on the entire second main surface 12.

(Apparatus for Manufacturing Silicon Carbide Epitaxial Substrate)

Next, the configuration of an apparatus 200 for manufacturing silicon carbide epitaxial substrate 100 according to the present embodiment is described.

Figure 6:
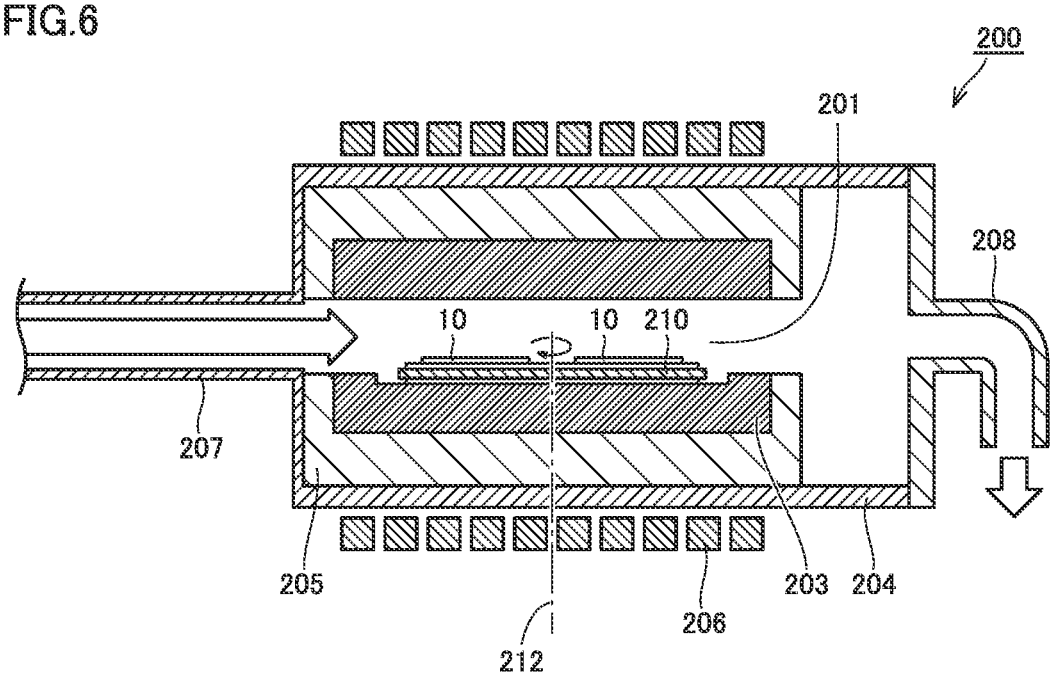
FIG. 6 is a schematic partial sectional view showing the configuration of an apparatus for manufacturing the silicon carbide epitaxial substrate according to the present embodiment.

As shown in FIG. 6, apparatus 200 for manufacturing silicon carbide epitaxial substrate 100 is a hot wall type lateral CVD (Chemical Vapor Deposition) apparatus, for example. Manufacturing apparatus 200 mainly has a reaction chamber 201, a heating element 203, a quartz tube 204, a heat insulator 205, and an induction heating coil 206.

Heating element 203 has a cylindrical shape, for example, and forms reaction chamber 201 therein. Heating element 203 is made of graphite, for example. Heat insulator 205 surrounds the outer circumference of heating element 203. Heat insulator 205 is provided inside quartz tube 204 so as to make contact with an inner circumferential surface of quartz tube 204. Induction heating coil 206 is wound along an outer circumferential surface of quartz tube 204, for example. Induction heating coil 206 is configured to supply an alternating current from an external power supply (not shown). Heating element 203 is thereby inductively heated. As a result, reaction chamber 201 is heated by heating element 203.

Reaction chamber 201 is a space formed by being surrounded by heating element 203. Silicon carbide single-crystal substrate 10 is disposed within reaction chamber 201. Reaction chamber 201 is configured to heat silicon carbide single-crystal substrate 10. Reaction chamber 201 is provided with a susceptor 210 to hold silicon carbide single-crystal substrate 10. Susceptor 210 is configured to rotate about a rotation axis 212.

Manufacturing apparatus 200 has a gas inlet port 207 and a gas outlet port 208. Gas outlet port 208 is connected to an air exhaust pump (not shown). Arrows in FIG. 6 indicate a flow of gas. Gas is introduced through gas inlet port 207 into reaction chamber 201, and exhausted through gas outlet port 208. A pressure in reaction chamber 201 is adjusted by a balance between an amount of supplied gas and an amount of exhausted gas.

Manufacturing apparatus 200 has a gas supply unit (not shown) configured to supply a mixed gas including silane, ammonia, hydrogen and propane, for example, to reaction chamber 201. Specifically, the gas supply unit may have a gas cylinder capable of supplying propane gas, a gas cylinder capable of supplying hydrogen gas, a gas cylinder capable of supplying silane gas, and a gas cylinder capable of supplying ammonia gas or a mixed gas of ammonia gas and nitrogen gas.

In an axial direction of reaction chamber 201, the density of turns of induction heating coil 206 may be changed. The density of turns [count/m] refers to the number of windings of the coil per unit length in the axial direction of the apparatus. For example, the density of turns of induction heating coil 206 on the upstream side may be higher than the density of turns of induction heating coil 206 on the downstream side, so as to effectively thermally decompose ammonia on the upstream side.

(Method for Manufacturing Silicon Carbide Epitaxial Substrate)

Next, a method for manufacturing the silicon carbide epitaxial substrate according to the present embodiment is described.

Figure 7:
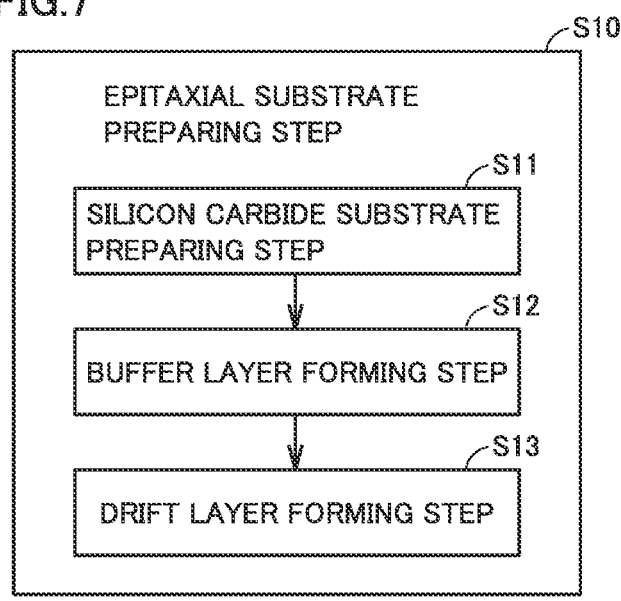
FIG. 7 is a flowchart schematically showing a method for manufacturing the silicon carbide epitaxial substrate according to the present embodiment.

First, a silicon carbide single-crystal substrate preparing step (S11: FIG. 7) is performed. A silicon carbide single crystal having a polytype of 4H is manufactured by sublimation, for example. Then, the silicon carbide single crystal is sliced by a wire saw, for example, whereby silicon carbide single-crystal substrate 10 is prepared. Silicon carbide single-crystal substrate 10 includes an n type impurity such as nitrogen. The conductivity type of silicon carbide single-crystal substrate 10 is n type, for example.

Figure 8:
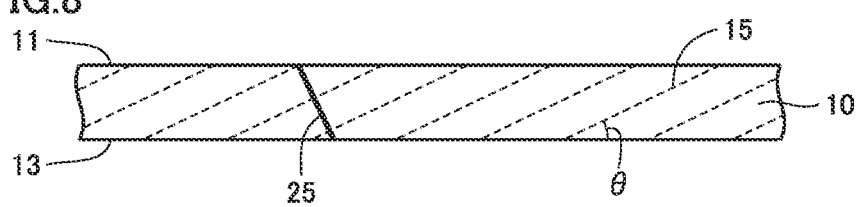
FIG. 8 is a schematic sectional view showing a first step of the method for manufacturing the silicon carbide epitaxial substrate according to the present embodiment.

As shown in FIG. 8, silicon carbide single-crystal substrate 10 has first main surface 11, and third main surface 13 opposite to first main surface 11. First main surface 11 is a plane inclined at off angle θ in an off direction relative to {0001} plane 15, for example. The off direction is a <11-20> direction, for example. The maximum diameter of first main surface 11 of silicon carbide single-crystal substrate 10 is 150 mm or more, for example. Threading screw dislocation 25 or carbon inclusion may exist, for example, in silicon carbide single-crystal substrate 10. The threading screw dislocation or the carbon inclusion often serves as the origin of occurrence of the first defect such as a triangle defect. Threading screw dislocation 25 extends in direction 103 perpendicular to {0001} plane 15.

Next, a buffer layer forming step (S12: FIG. 7) is performed. First, silicon carbide single-crystal substrate 10 is disposed on susceptor 210 within reaction chamber 201 (see FIG. 6). The pressure in reaction chamber 201 is reduced from atmospheric pressure to about from $1 \times 10^{-3}$ Pa to $1 \times 10^{-6}$ Pa by means of a vacuum pump, for example. After residual gas such as atmospheric components and water within reaction chamber 201 is reduced, a temperature increase of silicon carbide single-crystal substrate 10 is started.

Figure 9:
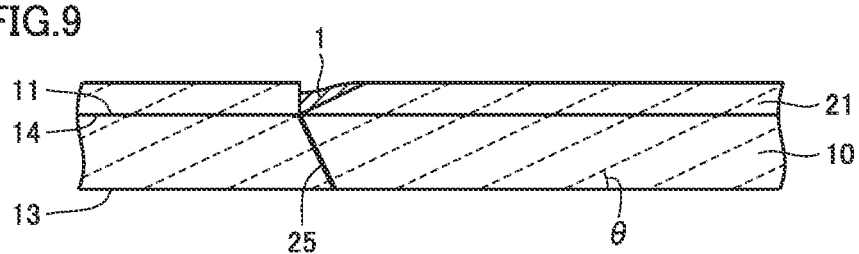
FIG. 9 is a schematic sectional view showing a second step of the method for manufacturing the silicon carbide epitaxial substrate according to the present embodiment.

After the temperature of silicon carbide single-crystal substrate 10 reaches 1600° C. or higher, for example, a source material gas, a dopant gas and a carrier gas are supplied to reaction chamber 201. Specifically, a mixed gas including silane, propane, ammonia and hydrogen is supplied to reaction chamber 201. The respective gases are thermally decomposed in reaction chamber 201, whereby buffer layer 21 is formed on silicon carbide single-crystal substrate 10 (see FIG. 9). In the step of forming buffer layer 21, susceptor 210 rotates about rotation axis 212. Silicon carbide single-crystal substrate 10 revolves about rotation axis 212 (see FIG. 6).

In the step of forming the buffer layer, flow rates of ammonia, silane and propane are adjusted so as to attain a (C+N)/Si ratio of 1.0 or less. Specifically, the flow rate of silane gas is adjusted to be 96 sccm, for example. The flow rate of propane gas is adjusted to be 30.3 sccm, for example. The flow rate of ammonia gas is adjusted to be 0.25 sccm. In this case, (C+N)/Si=(30.3×3+0.25)/96=about 0.95 is obtained. The concentration of nitrogen atoms contained in buffer layer 21 is about $1 \times 10^{18}$ cm$^{-3}$. The thickness of buffer layer 21 is 1.0 μm, for example. In this manner, buffer layer 21 is formed on silicon carbide single-crystal substrate 10 by epitaxial growth.

Ammonia gas is more likely to be thermally decomposed than nitrogen gas having a triple bond. Ammonia gas is more likely to be incorporated into silicon carbide than nitrogen gas. If buffer layer 21 having a similar concentration of nitrogen atoms is formed using nitrogen gas instead of ammonia gas, the nitrogen gas needs to have a flow rate of about 50 sccm. In this case, (C+N)/Si=(30.3×3+50×2)/96=about 1.99 is obtained.

Next, a drift layer forming step (S13: FIG. 7) is performed. A mixed gas including silane, propane, ammonia and hydrogen is supplied to reaction chamber 201, while the temperature of silicon carbide single-crystal substrate 10 is maintained at about 1640° C., for example. The respective gases are thermally decomposed in reaction chamber 201, whereby drift layer 22 is formed on buffer layer 21 (see FIGS. 2 and 5). In the step of forming drift layer 22, susceptor 210 rotates about rotation axis 212. Silicon carbide single-crystal substrate 10 revolves about rotation axis 212 (see FIG. 6).

In the step of forming the drift layer, flow rates of ammonia, silane and propane are adjusted so as to attain a (C+N)/Si ratio of about 1.35. Specifically, the flow rate of silane gas is adjusted to be 140 sccm, for example. The flow rate of propane gas is adjusted to be 63 sccm, for example. The flow rate of ammonia gas is adjusted to be 0.07 sccm. In this case, (C+N)/Si=(63×3+0.07)/140=about 1.35 is obtained. The concentration of nitrogen atoms contained in drift layer 22 is about $3 \times 10^{15}$ cm$^{-3}$. The thickness of drift layer 22 is 30 μm, for example. In this manner, drift layer 22 is formed on buffer layer 21 by epitaxial growth, whereby silicon carbide epitaxial substrate 100 is manufactured.

If buffer layer 21 having a similar concentration of nitrogen atoms is formed using nitrogen gas instead of ammonia gas, the nitrogen gas needs to have a flow rate of about 15 sccm. In this case, (C+N)/Si=(63×3+15×2)/140=about 1.56 is obtained.

(Mechanism to Suppress Extension of Defect)

Next, an estimation mechanism to suppress the extension of a defect is described.

During epitaxial growth of a silicon carbide layer, a N atom, which is closer in size to a C atom than to a Si atom, is considered to enter a C site rather than a Si site. A radical or a precursor having Si atoms or Si has the property of readily migrating on a growth surface during step-flow growth, as compared to when it has C atoms and N atoms. Accordingly, when epitaxial growth is performed under the condition of a higher ratio of Si atoms to C atoms and N atoms, satisfactory step-flow growth can be implemented, and a flat growth surface is obtained as a result. Conversely, when epitaxial growth is performed under the condition of a lower ratio of Si atoms to C atoms and N atoms, it is difficult to implement satisfactory step-flow growth, and it is considered that step bunching is likely to occur on the growth surface as a result.

Since ammonia gas is more likely to be thermally decomposed than nitrogen gas having a triple bond, as described above, N atoms are likely to be incorporated into a silicon carbide layer. In the case of ammonia gas, a silicon carbide layer having the same N atom concentration can be formed at a flow rate of about one several hundredth of the flow rate of nitrogen gas. Thus, when ammonia gas is used, a higher ratio of Si atoms to C atoms and N atoms can be attained than when nitrogen gas is used. It is therefore considered that satisfactory step-flow growth can be implemented when ammonia gas is used.

A defect having two-dimensional extension such as a triangle defect is considered to occur due to a threading screw dislocation, carbon inclusion or the like. More specifically, it is assumed that the following mechanism works: Silicon (Si atoms alone or a radical having Si and hydrogen linked together) is diffused on an epitaxial layer surface during film formation, with threading screw dislocations appearing on the surface. The diffusion of Si on the screw dislocations is inhibited by C atoms and/or N atoms, resulting in bonding by interaction. Such bonding does not form 4K—SiC but forms defects such as 3C—SiC, and these defects each form the core of a defect having two-dimensional extension. That is, these defects may each contribute to the occurrence of a triangle defect. By using ammonia gas in a step of forming a buffer layer at an early phase of growth (early stage of crystal growth), a buffer layer having a high N atom concentration of about $1 \times 10^{18}$ cm$^{-3}$ can be formed even when the ratio of (C+N)/Si is reduced to about 1.0 or less, for example.

In other words, a buffer layer can be formed under a Si-rich condition by using ammonia gas. Thus, satisfactory step-flow growth can be implemented at an early stage of crystal growth, so that two-dimensional extension of a defect can be suppressed that originates from a threading screw dislocation or carbon inclusion existing in a silicon carbide single-crystal substrate. As a result, it is considered that the probability of the threading screw dislocation or carbon inclusion growing into the first defect having large two-dimensional extension can be reduced, and the probability of the threading screw dislocation or carbon inclusion growing into the second defect having small two-dimensional extension can be increased.

(Method for Manufacturing Silicon Carbide Semiconductor Device)

Next, a method for manufacturing a silicon carbide semiconductor device 300 according to the present embodiment is described.

The method for manufacturing the silicon carbide semiconductor device according to the present embodiment mainly has an epitaxial substrate preparing step (S10: FIG. 10) and a substrate processing step (S20: FIG. 10).

First, the epitaxial substrate preparing step (S10: FIG. 10) is performed. Specifically, silicon carbide epitaxial substrate 100 is prepared with the method for manufacturing the silicon carbide epitaxial substrate described above (see FIG. 7).

Next, the substrate processing step (S20: FIG. 10) is performed. Specifically, the silicon carbide epitaxial substrate is processed, whereby a silicon carbide semiconductor device is manufactured. The "processing" includes various types of processing such as ion implantation, heat treatment, etching, oxide film formation, electrode formation, and dicing. That is, the substrate processing step may include at least one of the types of processing including ion implantation, heat treatment, etching, oxide film formation, electrode formation, and dicing.

Described below is a method for manufacturing a MOSFET (Metal Oxide Semiconductor Field Effect Transistor) as an example of the silicon carbide semiconductor device. The substrate processing step (S20: FIG. 10) includes an ion implanting step (S21: FIG. 10), an oxide film forming step (S22: FIG. 10), an electrode forming step (S23: FIG. 10), and a dicing step (S24: FIG. 10), for example.

First, the ion implanting step (S21: FIG. 10) is performed. A p type impurity such as aluminum (Al) is implanted into second main surface 12 on which a mask with an opening (not shown) has been formed. Consequently, a body region 132 having p type conductivity is formed. Then, an n type impurity such as phosphorus (P) is implanted into a prescribed position within body region 132. Consequently, a source region 133 having n type conductivity is formed. Then, a p type impurity such as aluminum is implanted into a prescribed position within source region 133. Consequently, a contact region 134 having p type conductivity is formed (see FIG. 11).

In silicon carbide layer 20, a portion other than body region 132, source region 133 and contact region 134 serves as a drift region 131. Source region 133 is separated from drift region 131 by body region 132. The ion implantation may be performed while silicon carbide epitaxial substrate 100 is heated at about 300° C. or more and 600° C. or less. After the ion implantation, silicon carbide epitaxial substrate 100 is subjected to activation annealing. The activation annealing activates the impurities implanted into silicon carbide layer 20, to generate a carrier in each region. The activation annealing is performed in an argon (Ar) atmosphere, for example. The activation annealing is performed at a temperature of about 1800° C., for example. The activation annealing is performed for a period of about 30 minutes, for example.

Figure 12:
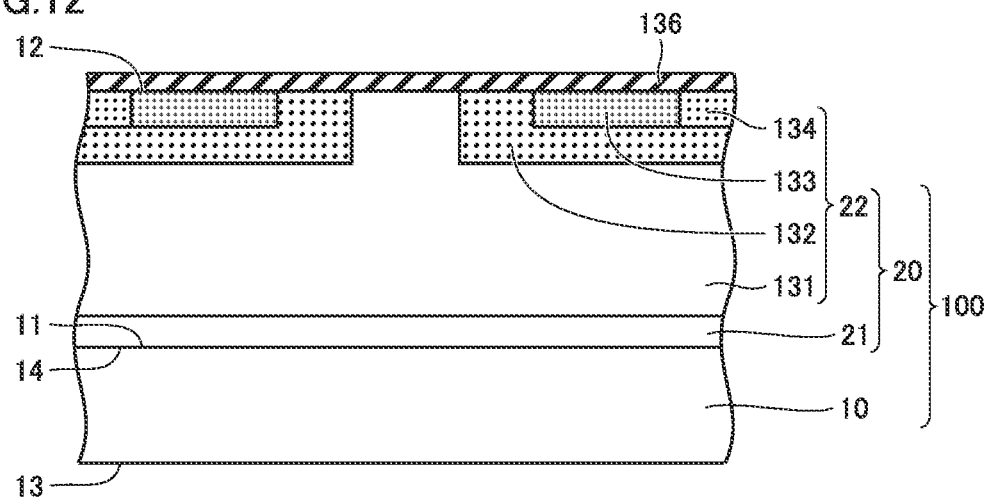
FIG. 12 is a schematic sectional view showing a second step of the method for manufacturing the silicon carbide semiconductor device according to the present embodiment.

Next, the oxide film forming step (S22: FIG. 10) is performed. Silicon carbide epitaxial substrate 100 is heated in an atmosphere including oxygen, for example, whereby an oxide film 136 is formed on second main surface 12 (see FIG. 12). Oxide film 136 is made of silicon dioxide, for example. Oxide film 136 functions as a gate insulating film. The thermal oxidation process is performed at a temperature of about 1300° C., for example. The thermal oxidation process is performed for a period of about 30 minutes, for example.

After oxide film 136 is formed, heat treatment may be further performed in a nitrogen atmosphere. For example, heat treatment is performed in an atmosphere of nitrogen monoxide at about 1100° C. for about one hour. Subsequently, heat treatment is further performed in an argon atmosphere. For example, heat treatment is performed in an argon atmosphere at about from 1100 to 1500° C. for about one hour.

Next, the electrode forming step (S23: FIG. 10) is performed. A first electrode 141 is formed on oxide film 136.

First electrode 141 functions as a gate electrode. First electrode 141 is formed by CVD, for example. First electrode 141 is made of polysilicon having conductivity, for example. First electrode 141 is formed at a position facing source region 133 and body region 132.

Next, an interlayer insulating film 137 is formed to cover first electrode 141. Interlayer insulating film 137 is formed by CVD, for example. Interlayer insulating film 137 is made of silicon dioxide, for example. Interlayer insulating film 137 is formed in contact with first electrode 141 and oxide film 136. Then, oxide film 136 and interlayer insulating film 137 at a prescribed position are removed by etching. Consequently, source region 133 and contact region 134 are exposed at oxide film 136.

Next, a second electrode 142 is formed at this exposed portion by sputtering, for example. Second electrode 142 functions as a source electrode. Second electrode 142 is made of titanium, aluminum and silicon, for example. After second electrode 142 is formed, second electrode 142 and silicon carbide epitaxial substrate 100 are heated at a temperature of about 900° C. or more and 1100° C. or less, for example. Consequently, second electrode 142 and silicon carbide epitaxial substrate 100 are brought into ohmic contact with each other. Then, a wiring layer 138 is formed in contact with second electrode 142. Wiring layer 138 is made of a material including aluminum, for example.

Next, a third electrode 143 is formed on third main surface 13. Third electrode 143 functions as a drain electrode. Third electrode 143 is made of an alloy including nickel and silicon, for example (Nisi, for example).

Figure 13:
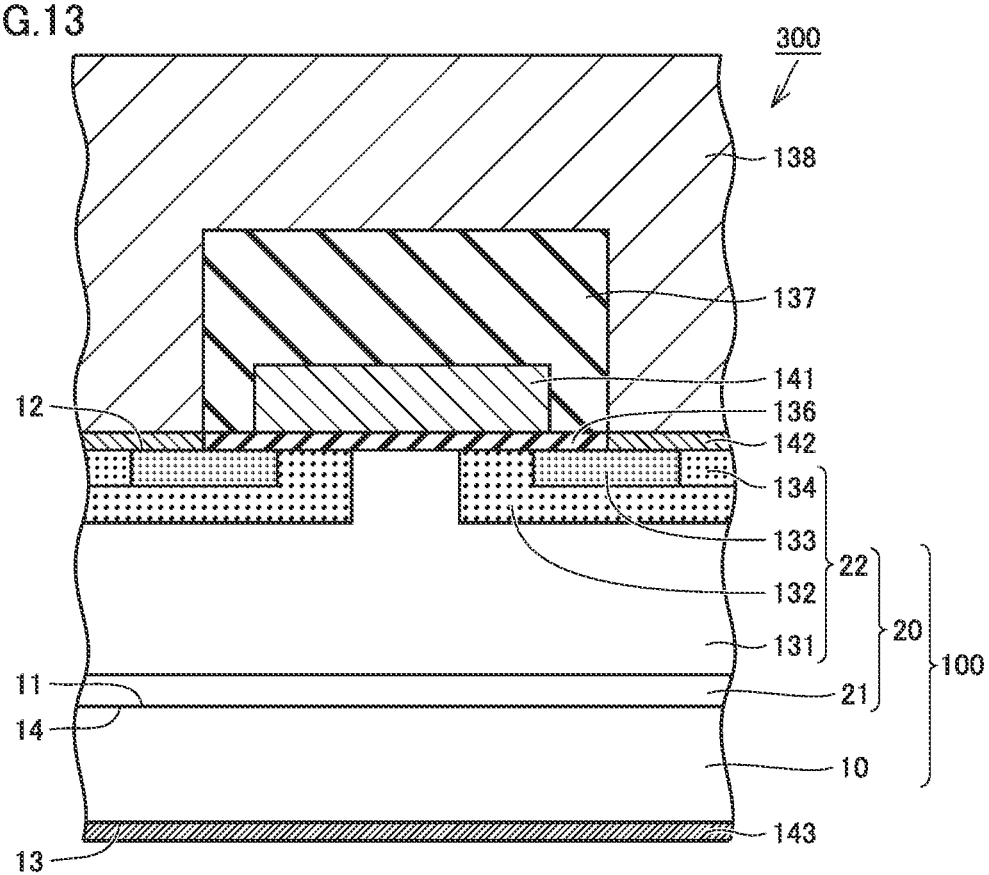
FIG. 13 is a schematic sectional view showing the configuration of the silicon carbide semiconductor device according to the present embodiment.

Next, the dicing step (S24: FIG. 10) is performed. Silicon carbide epitaxial substrate 100 is diced along dicing lines, for example, whereby silicon carbide epitaxial substrate 100 is divided into a plurality of semiconductor chips. In this manner, silicon carbide semiconductor device 300 is manufactured (see FIG. 13).

Although the method for manufacturing the silicon carbide semiconductor device according to the present disclosure has been described above with reference to a MOSFET as an example, the manufacturing method according to the present disclosure is not limited as such. The manufacturing method according to the present disclosure can be applied to silicon carbide semiconductor devices such as an IGBT (Insulated Gate Bipolar Transistor), a SBD (Schottky Barrier Diode), a thyristor, a GTO (Gate Turn Off thyristor), and a PiN diode.

It should be understood that the embodiments disclosed herein are illustrative and non-restrictive in every respect. The scope of the present invention is defined by the terms of the claims, rather than the embodiments described above, and is intended to include any modifications within the scope and meaning equivalent to the terms of the claims.

REFERENCE SIGNS LIST 1 first defect; 2 second defect; 10 silicon carbide single-crystal substrate; 11 first main surface; 12 second main surface; 13 third main surface; 14 fourth main surface; 15 {0001} plane; 16 first flat; 20 silicon carbide layer; 21 buffer layer; 22 drift layer; 25 threading screw dislocation; 100 silicon carbide epitaxial substrate; 101 first direction; 102 second direction; 103 third direction; 104 fourth direction; 105 fifth direction; 111 maximum diameter; 131 drift region; 132 body region; 133 source region; 134 contact region; 136 oxide film; 137 interlayer insulating film; 138 wiring layer; 141 first electrode; 142 second electrode; 143 third electrode; 200 manufacturing apparatus; 201 reaction chamber; 203 heating element; 204 quartz tube; 205 heat insulator; 206 induction heating coil; 207 gas inlet port; 208 gas outlet port; 210 susceptor; 212 rotation axis; 300 silicon carbide semiconductor device.

The invention claimed is:

1. A silicon carbide epitaxial substrate comprising:
a silicon carbide single-crystal substrate having a first main surface; and
a silicon carbide layer on the first main surface,
the silicon carbide layer including a surface in contact with the silicon carbide single-crystal substrate, and a second main surface opposite to the surface,
the second main surface being a plane inclined at an off angle in an off direction relative to a {0001} plane,
the second main surface having one or more defects, and
assuming that the one or more defects satisfying relations of Formula 1 and Formula 2 are first defects, and the one or more defects satisfying relations of Formula 3 and Formula 2 are second defects, where the off angle is θ°, a thickness of the silicon carbide layer in a direction perpendicular to the second main surface is W μm, a width of each of the one or more defects in a direction parallel to a direction obtained by projecting the off direction onto the second main surface is L μm, and a width of each of the one or more defects in a direction perpendicular to the off direction and parallel to the second main surface is Y μm, then a value obtained by dividing a number of the second defects by a sum of a number of the first defects and the number of the second defects being greater than 0.5:

$$\frac{L}{Y} \leq 1 \qquad \text{Formula 1}$$

$$0.8 \times \frac{W}{\tan\theta} < L < 1.2 \times \frac{W}{\tan\theta} \qquad \text{Formula 2}$$

$$1 < \frac{L}{Y}. \qquad \text{Formula 3}$$

2. The silicon carbide epitaxial substrate according to claim 1, wherein
the thickness of the silicon carbide layer is 5 μm or more and 100 μm or less.

3. The silicon carbide epitaxial substrate according to claim 1, wherein
the off angle is greater than 0° and smaller than or equal to 8°.

4. The silicon carbide epitaxial substrate according to claim 1, wherein
the value obtained by dividing the number of the second defects by the sum of the number of the first defects and the number of the second defects is greater than 0.6.

5. The silicon carbide epitaxial substrate according to claim 1, wherein
the value obtained by dividing the number of the second defects by the sum of the number of the first defects and the number of the second defects is greater than 0.7.

6. The silicon carbide epitaxial substrate according to claim 1, wherein
the value obtained by dividing the number of the second defects by the sum of the number of the first defects and the number of the second defects is greater than 0.8.

7. The silicon carbide epitaxial substrate according to claim 1, wherein
the value obtained by dividing the number of the second defects by the sum of the number of the first defects and the number of the second defects is greater than 0.9.

8. A method for manufacturing a silicon carbide semiconductor device, the method comprising:
preparing the silicon carbide epitaxial substrate according to claim 1; and
processing the silicon carbide epitaxial substrate.

9. A silicon carbide epitaxial substrate comprising:
a silicon carbide single-crystal substrate having a first main surface; and
a silicon carbide layer on the first main surface,
the silicon carbide layer including a surface in contact with the silicon carbide single-crystal substrate, and a second main surface opposite to the surface,
the second main surface being a plane inclined at an off angle in an off direction relative to a {0001} plane,
a thickness of the silicon carbide layer is 5 μm or more and 100 μm or less,
the off angle is greater than 0° and smaller than or equal to 8°, the second main surface having one or more defects, and
assuming that the one or more defects satisfying relations of Formula 1 and Formula 2 are first defects, and the one or more defects satisfying relations of Formula 3 and Formula 2 are second defects, where the off angle is θ°, the thickness of the silicon carbide layer in a direction perpendicular to the second main surface is W μm, a width of each of the one or more defects in a direction parallel to a direction obtained by projecting the off direction onto the second main surface is L μm, and a width of each of the one or more defects in a direction perpendicular to the off direction and parallel to the second main surface is Y μm, then a value obtained by dividing a number of the second defects by a sum of a number of the first defects and the number of the second defects being greater than 0.8:

$$\frac{L}{Y} \leqq 1 \qquad \text{Formula 1}$$

$$0.8 \times \frac{W}{\tan\theta} < L < 1.2 \times \frac{W}{\tan\theta} \qquad \text{Formula 2}$$

$$1 < \frac{L}{Y}. \qquad \text{Formula 3}$$

10. A method for manufacturing a silicon carbide semiconductor device, the method comprising:
preparing the silicon carbide epitaxial substrate according to claim 2; and
processing the silicon carbide epitaxial substrate.

11. A method for manufacturing a silicon carbide semiconductor device, the method comprising:
preparing the silicon carbide epitaxial substrate according to claim 3; and
processing the silicon carbide epitaxial substrate.

12. A method for manufacturing a silicon carbide semiconductor device, the method comprising:
preparing the silicon carbide epitaxial substrate according to claim 4; and
processing the silicon carbide epitaxial substrate.

13. A method for manufacturing a silicon carbide semiconductor device, the method comprising:
preparing the silicon carbide epitaxial substrate according to claim 5; and
processing the silicon carbide epitaxial substrate.

14. A method for manufacturing a silicon carbide semiconductor device, the method comprising:
preparing the silicon carbide epitaxial substrate according to claim 6; and
processing the silicon carbide epitaxial substrate.

15. A method for manufacturing a silicon carbide semiconductor device, the method comprising:
preparing the silicon carbide epitaxial substrate according to claim 7; and
processing the silicon carbide epitaxial substrate.

16. A method for manufacturing a silicon carbide semiconductor device, the method comprising:
preparing the silicon carbide epitaxial substrate according to claim 9; and
processing the silicon carbide epitaxial substrate.

* * * * *